(12) United States Patent
Niwa

(10) Patent No.: US 9,923,477 B2
(45) Date of Patent: Mar. 20, 2018

(54) PWM RECTIFIER INCLUDING CAPACITANCE CALCULATION UNIT

(71) Applicant: FANUC CORPORATION, Yamanashi (JP)

(72) Inventor: Masakazu Niwa, Yamanashi (JP)

(*) Notice: Subject to any disclaimer, the term of this patent is extended or adjusted under 35 U.S.C. 154(b) by 0 days.

(21) Appl. No.: 15/387,581

(22) Filed: Dec. 21, 2016

(65) Prior Publication Data
US 2017/0099012 A1 Apr. 6, 2017

Related U.S. Application Data

(63) Continuation of application No. 14/849,056, filed on Sep. 9, 2015, now abandoned.

(30) Foreign Application Priority Data

Sep. 10, 2014 (JP) .................................. 2014-184549

(51) Int. Cl.
| | |
|---|---|
| H02M 7/217 | (2006.01) |
| H02M 5/458 | (2006.01) |
| H02M 1/42 | (2007.01) |
| G01R 31/40 | (2014.01) |
| G01R 27/26 | (2006.01) |

(Continued)

(52) U.S. Cl.
CPC ........... H02M 5/4585 (2013.01); G01R 27/26 (2013.01); G01R 31/40 (2013.01); H02M 1/32 (2013.01); H02M 1/4225 (2013.01); H02M 7/219 (2013.01); H02M 7/2173 (2013.01)

(58) Field of Classification Search
CPC ............................ H02M 1/42–1/4258; H02M 2001/4283–2001/4291; H02M 7/155–7/1626; H02M 7/217–2007/2195; H02M 5/458; H02M 5/4585
See application file for complete search history.

(56) References Cited

U.S. PATENT DOCUMENTS

| | | |
|---|---|---|
| 8,183,874 B2 | 5/2012 | Dommaschk et al. |
| 9,294,005 B2 | 3/2016 | Tallam et al. |

(Continued)

FOREIGN PATENT DOCUMENTS

| | | |
|---|---|---|
| CN | 101142738 A | 3/2008 |
| CN | 102130625 A | 7/2011 |

(Continued)

*Primary Examiner* — Gary L Laxton
*Assistant Examiner* — Peter Novak
(74) *Attorney, Agent, or Firm* — Hauptman Ham, LLP

(57) ABSTRACT

A PWM rectifier includes a main circuit unit carrying out AC-DC power conversion by PWM-control, a PWM control unit PWM-controlling the main circuit unit, a DC voltage detection unit detecting a DC voltage across a smoothing capacitor connected to the DC-side of the main circuit unit, a DC voltage storage unit storing respective DC voltages at the start and end times of an initial boost period during which the smoothing capacitor having been charged to an AC voltage peak value is further charged to a higher voltage, an input power calculation unit calculating input power flowing in from the AC-side based on an AC voltage and current, an integral power calculation unit calculating integral power from the input power over the initial boost period, and a capacitance calculation unit calculating the capacitance of the smoothing capacitor based on the respective DC voltages and the integral power.

5 Claims, 4 Drawing Sheets

(51) Int. Cl.
 *H02M 1/32* (2007.01)
 *H02M 7/219* (2006.01)

(56) References Cited

U.S. PATENT DOCUMENTS

| | | |
|---|---|---|
| 9,318,944 B2 | 4/2016 | Royak et al. |
| 2011/0134672 A1 | 6/2011 | Sato et al. |

FOREIGN PATENT DOCUMENTS

| | | | |
|---|---|---|---|
| CN | 103368497 A | 10/2013 | |
| JP | 5-76180 A | 3/1993 | |
| JP | 5-215800 A | 8/1993 | |
| JP | 5-308701 A | 11/1993 | |
| JP | 8-282431 A | 10/1996 | |
| JP | 10-14097 A | 1/1998 | |
| JP | 2003-66078 A | 3/2003 | |
| JP | 2011-101474 A | 5/2011 | |
| KR | 10-2012-0034451 A | 4/2012 | |
| WO | 2005/088814 A1 | 9/2005 | |
| WO | 2008/149530 A1 | 12/2008 | |
| WO | 2010/055556 A1 | 5/2010 | |

PWM RECTIFIER INCLUDING CAPACITANCE CALCULATION UNIT

RELATED APPLICATIONS

The present application is a continuation of U.S. application Ser. No. 14/849,056, filed Sep. 9, 2015, which claims priority to Japanese Application Number 2014-184549, filed Sep. 10, 2014. The disclosures of the above-listed applications are hereby incorporated by reference herein in their entirety.

FIELD OF THE INVENTION

The present invention relates to a PWM rectifier that converts AC power to DC power by controlling a switching element using a PWM signal (pulse width modulation signal).

DESCRIPTION OF THE RELATED ART

A motor control device for driving a motor in a machine tool, an industrial machine, a forming machine, an injection molding machine, or various types of robots uses AC power, to which AC power input from the AC power supply side is once converted to DC power and the DC power is further converted, as drive power of a motor attached to each drive shaft is known. A motor control device includes a rectifier configured to rectify AC power supplied from the AC power supply side and output DC power and an inverter connected to a DC link on the DC side of the rectifier and configured to carry out bilateral power conversion between DC power at the DC link and drive power for a motor or AC power which is regenerative power, and controls the speed, torque, or rotor position of a motor connected to the AC side of the inverter.

Such rectifiers include a rectifier using a diode rectification method. A rectifier using a diode rectification method has an advantage of low price but also has a disadvantage that power line harmonics or reactive power increases.

On the other hand, recent years, the application of a rectifier using pulse width modulation (PWM) (hereinafter, referred to as PWM rectifier) has been spreading because of requirements for a reduction in power line harmonics or a reduction in reactive power.

FIG. 4 is a diagram illustrating a configuration of a general motor control device including a PWM rectifier. A motor control device 101 includes a PWM rectifier 1 configured to convert AC power from a commercial three-phase AC power supply 3 (hereinafter, simply referred to as AC power supply) to DC power and an inverter 2 configured to convert the DC power output from the PWM rectifier 1 to AC power with a desirable frequency, which is supplied as drive power of a motor 4, or convert AC power regenerated from the motor 4 to DC power, and controls the speed, torque, or rotor position of the motor 4, which is connected to the AC side of the inverter 2. The PWM rectifier 1 and the inverter 2 are connected to each other through a DC link. In the DC link, a smoothing capacitor 5 is incorporated, as will be described later. On the AC power supply 3 side of the PWM rectifier 1, a boost reactor 6 is connected.

The PWM rectifier 1 is mainly configured with a main circuit unit 11 that is a bridge circuit composed of a switching element and a diode connected thereto in inverse-parallel and a PWM control unit 12 that generates a PWM control signal to control a switching operation of the switching element in the main circuit unit 11.

The main circuit unit 11 of the PWM rectifier 1 is configured with a bridge circuit with the number of phases corresponding to the number of phases of the AC power supply 3. For example, when the AC power supply 3 is a three-phase AC power supply, the main circuit unit 11 of the PWM rectifier 1 is correspondingly a three-phase full-bridge circuit. To the DC side of the main circuit unit 11 of the PWM rectifier 1, the smoothing capacitor 5 is connected in parallel to smooth DC output from the PWM rectifier 1.

The PWM control unit 12 of the PWM rectifier 1 generates a PWM control signal based on an AC voltage value on the AC power supply 3 side, which is detected by an AC voltage detection unit 32, an AC current value on the AC power supply 3 side, which is detected by an AC current detection unit 33, and a DC voltage across the smoothing capacitor 5 (i.e., DC voltage across the DC link which is disposed between the main circuit unit 11 of the PWM rectifier 1 and the inverter 2), which is detected by a DC voltage detection unit 13. The PWM control signal is generated so as to generate AC power with a power factor of 1 in the main circuit unit 11 of the PWM rectifier 1 and keep a DC voltage which is output from the PWM rectifier 1 (i.e., DC voltage across the smoothing capacitor 5) at a desirable value and applied to the switching element in the main circuit unit 11 of the PWM rectifier 1. Although regenerative power is generated in the motor 4 in decelerating the motor 4 controlled by the motor control device 101, the PWM rectifier 1 is capable of carrying out a regenerative operation (reverse conversion operation) to convert DC power to AC power with a switching operation by the switching element inside the PWM rectifier 1 being controlled by the PWM control signal and returning regenerative energy, which is returned through the inverter 2, further to the AC power supply 3 side.

The smoothing capacitor 5 needs to have been charged in a period from immediately after the activation of the motor control device 101 until before the start of driving the motor 4 (i.e. before the start of a power conversion operation by the inverter 2). Hereinafter, charging of the smoothing capacitor 5 before the start of driving the motor 4 will be referred to as initial charging. When energy has not been stored in the smoothing capacitor 5 at the start time of the initial charging, a large inrush current flows through the main circuit unit 11 of the PWM rectifier 1. In particular, the larger the capacitance of the smoothing capacitor 5 becomes, the higher the generated inrush current becomes. As a countermeasure against the inrush current, an initial charging circuit 31 is generally disposed between the main circuit unit 11 of the PWM rectifier 1 and the smoothing capacitor 5 or on the three-phase AC input side of the main circuit unit 11 of the PWM rectifier 1. The example in FIG. 4 illustrates a case in which the initial charging circuit 31 is disposed between the main circuit unit 11 of the PWM rectifier 1 and the smoothing capacitor 5.

The initial charging circuit 31 includes a switch unit 41 and a charging resistor 42 which is connected to the switch unit 41 in parallel. The switch unit 41 is turned off (opened) only in the initial charging period of the smoothing capacitor 5 immediately after the activation of the motor control device 101 and maintains the off-state (closed state) in a regular operation period during which the motor control device 101 drives the motor 4. More specifically, by turning off (opening) the switch unit 41 in the initial charging period from immediately after the activation of the motor control device 101 until before the start of driving the motor 4, DC power output from the main circuit unit 11 flows into the smoothing capacitor 5 through a charging resistor 42 and the smoothing capacitor 5 is charged. When the smoothing capacitor 5 has been charged to a peak value of the AC voltage at the AC power supply 3, the switch unit 41 is turned on (closed) and the initial charging operation is finished.

The PWM rectifier 1 theoretically needs to output a DC voltage value higher than or equal to the peak value of the AC voltage at the AC power supply 3. Therefore, after the finish of the initial charging operation for the smoothing capacitor 5, the PWM control unit 12, by making the switching element in the main circuit unit 11 carry out a switching operation, boosts a DC voltage across the smoothing capacitor 5 to a voltage higher than the peak value of the AC voltage on the AC power supply 3 side. Hereinafter, a boost for the smoothing capacitor 5 in a period from after the finish of the initial charging for the smoothing capacitor 5 until before the start of driving the motor 4 will be referred to as initial boost. After the finish of the initial charging operation and the initial boost operation, the inverter 2 starts a power conversion operation and transitions to a regular operation mode in which the inverter 2 supplies the motor 4 with drive power, and the motor 4 is driven based on the AC drive power output from the inverter 2.

It is generally known that the smoothing capacitor 5 is a product with a limited life, which decreases the capacitance thereof (also referred to as capacitor capacity) by repeating charge and discharge. When the capacitance of the smoothing capacitor 5 decreases, a problem is caused in that a ripple current which flows through the DC link increases and fluctuation of the DC voltage grows. Therefore, it is important to measure the capacitance of the smoothing capacitor 5 accurately. A smoothing capacitor 5 the performance of which is judged to have deteriorated as a result of the measurement needs to be replaced.

Methods to estimate the capacitance of a smoothing capacitor disposed in a DC link of a rectifier include a method in which, as disclosed in, for example, Japanese Unexamined Patent Publication No. 05-76180, the capacitance is calculated by calculating a time constant based on a DC voltage value across the smoothing capacitor (DC voltage across the DC link) in initial charging and dividing the calculated time constant by the resistance value of a charging resistor. FIG. 5 is a diagram illustrating a capacitor voltage in initial charging in the invention disclosed in Japanese Unexamined Patent Publication No. 05-76180. After the initial charging to a smoothing capacitor (electrolytic capacitor) is started at the time t=0, the DC voltage across the smoothing capacitor increases with a first order lag as illustrated in FIG. 5. When the resistance of a charging resistor and the capacitance of a smoothing capacitor are denoted by R [Ω] and C [F], respectively, the first order lag time constant is expressed by RC. Thus, the capacitance C of the smoothing capacitor is estimated by measuring the time t1 at which the DC voltage reaches a voltage of 0.63 V, which is 0.63 times of a peak value V of the AC voltage on the AC power supply side, and dividing the measured time t1 by the resistance value R of the charging resistor.

The methods to estimate the capacitance of a smoothing capacitor also include a method in which, as disclosed in, for example, International Publication No. 2010/055556, the capacitance is calculated by estimating an amount of charge that flows into a DC link in the initial charging of the smoothing capacitor and dividing the charge amount by the DC voltage at the finish of the initial charging. According to the method, the capacitance is calculated by assuming an approximation that an inflowing current to the smoothing capacitor in an initial charging period is equal to the absolute value of the AC current on the AC power supply side, calculating the amount of charge that is stored in the smoothing capacitor from an integral value in initial charging, and dividing the charge amount by the DC voltage at the finish of the initial charging.

As described above, since there is a problem that as the capacitance of the smoothing capacitor, which is connected to the DC output side in parallel, decreases due to repeated charge and discharge, a ripple current flowing through the DC link increases and fluctuation of the DC voltage grows, it is important to measure the capacitance of the smoothing capacitor accurately. If it is not possible to measure the capacitance of the smoothing capacitor accurately, timing for the replacement of the smoothing capacitor may be missed and a substantial ripple current and DC voltage fluctuation may be caused to the DC link. Alternatively, a case in which a smoothing capacitor which has not reached the end of a lifespan thereof is replaced unnecessarily may be caused.

For example, since, in the invention disclosed in Japanese Unexamined Patent Publication No. 05-76180, the capacitance of the smoothing capacitor to be estimated depends on the peak value of the AC voltage on the AC power supply side and the resistance value of the charging resistor, it is not possible to measure the capacitance of the smoothing capacitor accurately when the peak value of the AC voltage and the resistance value of the charging resistor contain errors.

For example, according to the invention disclosed in International Publication No. 2010/055556, although, when the AC power supply is a single-phase AC power supply, no substantial error is caused even if the inflowing current to the smoothing capacitor is approximated to the absolute value of the AC current on the AC power supply side, such an approximation is not possible when the AC power supply is a three-phase AC power supply and it is thus not possible to know the inflowing current to the smoothing capacitor accurately. Although it may be possible to calculate the capacitance of the smoothing capacitor accurately by disposing a DC current detection unit at the preceding stage or the succeeding stage of an initial charging circuit and measuring the inflowing current to the smoothing capacitor, newly disposing the DC current detection unit leads to an increase in cost and space.

SUMMARY

In consideration of the above-described problems, an object of the present invention is to provide a small and low-cost PWM rectifier that is capable of accurately measuring the capacitance of a smoothing capacitor which is connected to the DC output side in parallel.

To achieve the above-described object, the PWM rectifier includes a main circuit unit configured to carry out power conversion between AC power on the AC side thereof and DC power on the DC side thereof through a switching operation of a switching element being PWM-controlled by a received PWM control signal, a PWM control unit configured to generate and output the PWM control signal to the main circuit unit, a DC voltage detection unit configured to detect a DC voltage across a smoothing capacitor, which is connected to the DC side of the main circuit unit in parallel, a DC voltage storage unit configured to, in an initial boost period during which the smoothing capacitor, which has been initially charged to a peak value of an AC voltage on the AC side of the main circuit unit, is further charged to a voltage higher than the peak value of the AC voltage through a power conversion operation of the main circuit unit, store respective DC voltages detected by the DC voltage detection unit at the start time and the end time of the initial boost period, an input power calculation unit configured to calculate input power flowing into the main circuit unit from the AC side based on an AC voltage and an AC current on the AC side of the main circuit unit, an integral power calculation unit configured to integrate input power calculated by the input power calculation unit during the initial boost period and output the integrated value as integral power, and a capacitance calculation unit configured to calculate the capacitance of the smoothing capacitor based on a DC voltage at the start time of the initial boost period and a DC voltage at the end time of the initial boost period, which are stored in the DC voltage storage unit, and the integral power.

When it is assumed that a DC voltage at the start time of the initial boost period, a DC voltage at the end time of the initial boost period, and the integral power are denoted by $V_L$, $V_H$, and W, respectively, the capacitance calculation unit calculates a capacitance C of the smoothing capacitor by the following equation.

$$C = \frac{2 \times W}{(V_H^2 - V_L^2)}$$

The PWM rectifier may further include a capacitance drop judgment unit configured to judge whether or not the capacitance calculated by the capacitance calculation unit is lower than a predetermined value, and a warning signal output unit configured to output a warning signal when the capacitance drop judgment unit judges that the capacitance is lower than the predetermined value.

The PWM rectifier may further include a notification unit configured to prompt the replacement of the smoothing capacitor, which is connected to the DC side of the main circuit unit in parallel, when the warning signal output unit outputs the warning signal.

The PWM rectifier may further include a stop instruction unit configured to instruct stop of a switching operation of the switching element in the main circuit unit when the warning signal output unit outputs the warning signal.

BRIEF DESCRIPTION OF DRAWINGS

The present invention will be understood more clearly by referring to the following accompanying drawings.

DESCRIPTION OF EMBODIMENTS

A PWM rectifier including a capacitance calculation unit will be described below with reference to the accompanying drawings. However, it should be understood that the present invention is not limited to the drawings or embodiments which will be described below.

In the following description, a case in which a PWM rectifier is disposed in a motor control device which is connected to an inverter through a DC link having a smoothing capacitor will be described as an embodiment. However, the PWM rectifier is not particularly limited to use as a rectifier in a motor control device, and the PWM rectifier may be applied to any device that has a configuration in which a PWM rectifier and an inverter are connected through a DC link having a smoothing capacitor. A load connected to the configuration is also not particularly limited to a motor.

Figure 1:
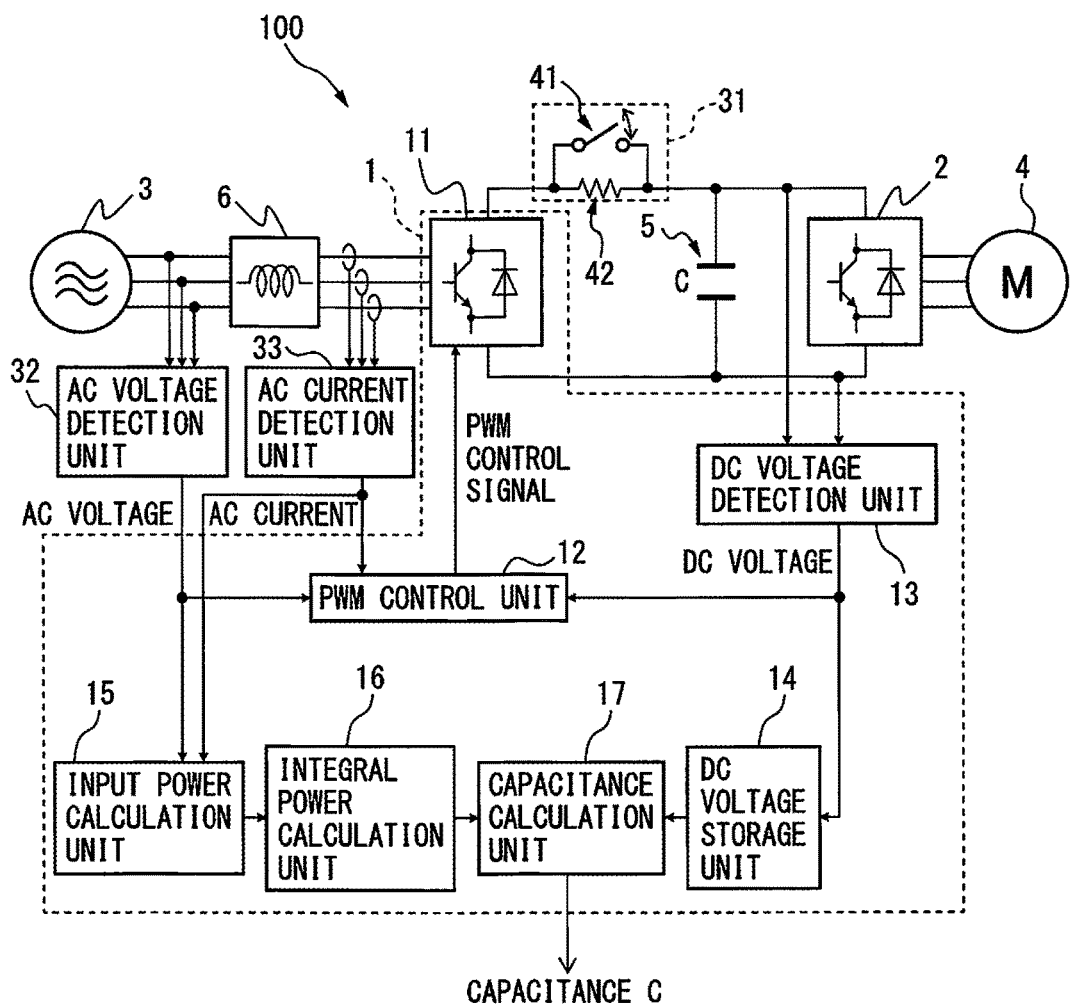
FIG. 1 is a principle block diagram of a PWM rectifier according to an embodiment.

FIG. 1 is a principle block diagram illustrating a PWM rectifier according to an embodiment. A motor control device 100 includes a PWM rectifier 1 according to the embodiment and an inverter 2 that is connected to a DC link, which is a circuit on the DC side of the PWM rectifier 1. A smoothing capacitor 5 is disposed in the DC link. A commercial three-phase AC power supply 3 is connected to the AC power supply side of the motor control device 100, i.e. the AC power supply side of the PWM rectifier 1, through a boost reactor 6, and a three-phase motor 4 is connected to the AC motor side of the motor control device 100, i.e. the AC motor side of the inverter 2.

Although, in the embodiment, the motor control device 100 which drive-controls a motor 4 will be described, the number of motors 4 which are driven-controlled does not particularly limit the present invention, and the present invention is applicable to a motor control device that drive-controls a plurality of motors 4. The type of the motor 4 driven by the motor control device 100 also does not particularly limit the present invention. For example, the motor 4 may be an induction motor or a synchronous motor. As for the number of phases, the motor 4 may be, for example, a single-phase motor or another polyphase motor.

Inverters 2 of the same number as the number of motors 4 are connected in parallel. Although, in the embodiment, a single inverter 2 is disposed since a single motor 4 is driven-controlled, when a plurality of motor 4 are driven-controlled, a plurality of inverters 2 are disposed to supply each motor 4 with drive power individually. The type of the inverter 2 also does not particularly limit the present invention. Any type of inverter may be used as long as the inverter carries out bilateral power conversion between DC power at the DC link and AC power which is drive power or regenerative power of the motor 4. For example, the inverter 2 may be an inverter that is configured as a PWM inverter having a switching element internally and converts DC power supplied from the DC link side to three-phase AC power with a desirable voltage and a desirable frequency to make the internal switching element carry out switching operation based on a PWM control signal and drive the motor 4. With this configuration, the motor 4 operates based on the voltage-variable and frequency-variable three-phase AC power supplied by the inverter 2. Although regenerative power is produced in braking the motor 4, the inverter 2 configured as a PWM inverter is capable of returning the regenerative energy produced in the motor 4 to the DC link side by carrying out regenerative operation (forward conversion operation), in which the AC regenerative power is converted to DC power through the switching operation of the internal switching element under the control of the PWM control signal.

First, a configuration of the PWM rectifier 1 according to the embodiment will be described. The PWM rectifier 1 according to the embodiment includes a main circuit unit 11, a PWM control unit 12, a DC voltage detection unit 13, a DC voltage storage unit 14, an input power calculation unit 15, an integral power calculation unit 16, and a capacitance calculation unit 17.

The main circuit unit 11 is configured with a bridge circuit of a switching element and a diode connected to the switching element in inverse-parallel. Although examples of the switching element include an IGBT, a thyristor, a GTO (Gate Turn-OFF thyristor), and a transistor, the type of the switching element itself does not limit the present invention, and other types of semiconductor device may be used. In the embodiment, since the AC power supply 3 is exemplified by a three-phase AC power supply, it is assumed that the main circuit unit 11 of the PWM rectifier 1 is a three-phase full-bridge circuit. However, the number of phases of the PWM rectifier 1 does not limit the present invention, and the PWM rectifier 1 may be configured as a full-bridge circuit with the number of phases corresponding to the number of phases of the AC power supply 3. For example, when the AC power supply 3 is a single-phase AC power supply, the main circuit unit 11 of the PWM rectifier 1 may be configured as a single-phase full-bridge circuit correspondingly.

The main circuit unit 11 carries out power conversion between AC power on the AC power supply 3 side and DC power at the DC link on the DC side by the switching operation of the switching element being PWM-controlled based on the PWM control signal received from the PWM control unit 12. In other words, based on the received PWM control signal, either a powering operation (forward conversion operation) which converts AC power to DC power or a regenerative operation (reverse conversion operation) which converts DC power to AC power is carried out.

The PWM control unit 12 generates and outputs a PWM control signal to the main circuit unit 11. In a regular operation (i.e., in a regular operation of the motor 4 by the motor control device 100), the PWM rectifier 1 carries out feedback control so that the DC voltage across the smoothing capacitor 5, which is detected by the DC voltage detection unit 13, follows a DC voltage command value, which is input from the outside. With this configuration, the DC voltage across the smoothing capacitor 5 is controlled constant. On the other hand, before an operation of the motor 4 by the motor control device 100, although details will be described later, the PWM control unit 12 generates a PWM control signal that makes the main circuit unit 11 carry out an initial boost operation.

The smoothing capacitor 5 is connected to the DC side of the main circuit unit 11 in parallel. The smoothing capacitor 5 has not only a function to suppress ripples in the DC output from the main circuit unit 11 of the PWM rectifier 1 or the inverter 2, but also a function to primarily store DC power output from the main circuit unit 11 or the inverter 2.

The DC voltage detection unit 13 detects a DC voltage across the smoothing capacitor 5.

The initial charging circuit 31 is a circuit to charge the smoothing capacitor 5 with a DC current output from the main circuit unit 11 of the PWM rectifier 1 in an initial charging period before the operation of the motor 4 by the motor control device 100, and is disposed between the main circuit unit 11 of the PWM rectifier 1 and the smoothing capacitor 5 in the embodiment. As an alternative example for the configuration, the initial charging circuit 31 may be disposed on the AC power supply side of the main circuit unit 11, and, in a case of a three-phase AC power supply 3, for example, an initial charging circuit 31 is disposed with respect to each phase of at least two phases among three phases of the three-phase AC input of the main circuit unit 11. Although a case in which a single inverter 2 is disposed is illustrated in FIG. 1, when, for example, a plurality of inverters 2 are connected in parallel, smoothing capacitors 5 also have a relation of being connected in parallel to one another. Thus, between the main circuit unit 11 and these smoothing capacitors 5, an initial charging circuit 31 is disposed.

The initial charging circuit 31 includes a switch unit 41 and a charging resistor 42 which is connected to the switch unit 41 in parallel. The switch unit 41 is configured with, for example, a mechanical switch, or a semiconductor switching element, such as an IGBT and a thyristor. The switch unit 41 is turned off (opened) only in the initial charging period of the smoothing capacitor 5 immediately after the activation of the motor control device 100, and maintained at the on-state (closed state) during the regular operation period in which the motor control device 100 drives the motor 4. More specifically, the switch unit 41 being turned off (opened) during the initial charging period from immediately after the activation of the motor control device 100 until before the start of driving the motor 4 makes the DC power output from the main circuit unit 11 flow into the smoothing capacitor 5 through the charging resistor 42 to charge the smoothing capacitor 5. When the smoothing capacitor 5 has been charged to the peak value of the AC voltage of the AC power supply 3, the switch unit 41 is turned on (closed) and the initial charging operation finishes.

As described above, since the PWM rectifier 1 theoretically needs to output a DC voltage with a value equal to or higher than the peak value of the AC voltage of the AC power supply 3, after the finish of the initial charging operation for the smoothing capacitor 5, the PWM control unit 12 generates a PWM control signal to make the main circuit unit 11 carry out an initial boost operation, in which the DC voltage across the smoothing capacitor 5, which has been initially charged to the peak value of the AC voltage, is boosted to a voltage value higher than the peak value of the AC voltage. The DC voltage storage unit 14 stores respective DC voltage values detected by the DC voltage detection unit at the start time and the end time of the initial boost period. The DC voltage storage unit 14 may be configured with either a volatile memory or a nonvolatile memory.

The input power calculation unit 15 calculates input power that flows into the main circuit unit 11 from the AC side based on an AC voltage on the AC side of the main circuit unit 11 detected by the AC voltage detection unit 32 and an AC current on the AC side of the main circuit unit 11 detected by the AC current detection unit 33. Since the motor control device 100 uses the AC voltage value and the AC current value on the AC power supply 3 side to drive-control the PWM rectifier 1, the AC voltage detection unit 32 and the AC current detection unit 33 to detect the AC voltage and the AC current are generally disposed in the motor control device 100. The input power calculation unit 15 uses the detected values from the AC voltage detection unit 32 and the AC current detection unit 33 for calculation.

The integral power calculation unit 16 integrates the input power calculated by the input power calculation unit 15 over the initial boost period and outputs the integrated value as integral power.

The capacitance calculation unit 17 calculates the capacitance of the smoothing capacitor based on the DC voltage at the start time of the initial boost period and the DC voltage at the end time of the initial boost period, which are stored in the DC voltage storage unit 14, and the integral power, which is calculated by the integral power calculation unit 16.

Figure 2:
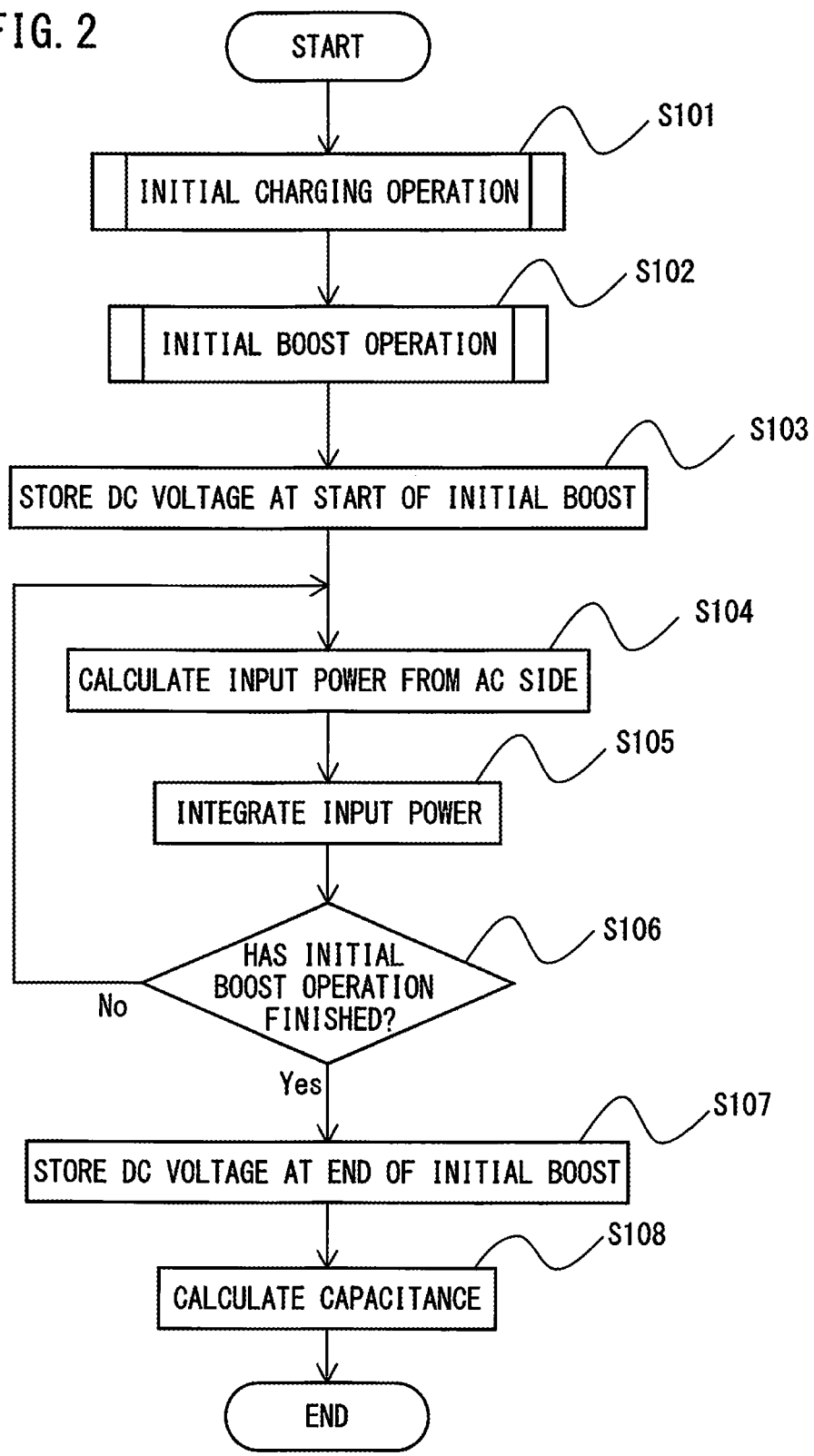
FIG. 2 is a flowchart illustrating calculation processing of the capacitance of a smoothing capacitor 5 of the PWM rectifier 1 illustrated in FIG. 1.

Next, calculation of the capacitance of the smoothing capacitor 5 in the PWM rectifier 1 illustrated in FIG. 1 will be described. FIG. 2 is a flowchart illustrating calculation processing of the capacitance of the smoothing capacitor 5 in the PWM rectifier 1 illustrated in FIG. 1.

First, immediately after the activation of the motor control device 100, the initial charging operation is carried out in step S101. In other words, the switch unit 41 of the initial charging circuit 31 is turned off (opened), DC power output from the main circuit unit 11 flows into the smoothing capacitor 5 through the charging resistor 42, and the smoothing capacitor 5 is charged. When the smoothing capacitor 5 has been charged to the peak value of the AC voltage of the AC power supply 3, the switch unit 41 is turned on (closed) and the initial charging operation is finished. The inverter 2 does not operate during the initial charging period.

Next, the initial boost operation is started in step S102. During the initial boost period, the switch unit 41 of the initial charging circuit 31 is kept on (closed), and no current flows through the charging resistor 42. Since the inverter 2 has also not operated yet, the AC power taken in from the AC power supply 3 side is converted (rectified) to DC power by the main circuit unit 11 of the PWM rectifier 1 and all stored in the smoothing capacitor 5.

In step S103, the DC voltage storage unit 14 first stores a DC voltage $V_L$, which is detected by the DC voltage detection unit 13 at the start time of the initial boost period, across the smoothing capacitor 5, which has been initially charged in step S101.

In step S104, the input power calculation unit 15, based on the AC voltage on the AC side of the main circuit unit 11, which is detected by the AC voltage detection unit 32, and the AC current on the AC side of the main circuit unit 11, which is detected by the AC current detection unit 33, calculates input power that flows into the main circuit unit 11 from the AC side. The input power is calculated as instantaneous active power. In other words, when it is assumed that the AC voltage on the AC side of the main circuit unit 11, which is detected by the AC voltage detection unit 32, is denoted by $E_u$, $E_v$, and $E_w$ and the AC current on the AC side of the main circuit unit 11, which is detected by AC current detection unit 33, is denoted by $I_u$, $I_v$, and $I_w$, input power P which flows into the main circuit unit 11 from the AC side is calculated by the following formula (1).

$$P = E_u \times I_u + E_v \times I_v + E_u \times I_w \quad (1)$$

In step S105, the integral power calculation unit 16 integrates the input power calculated by the input power calculation unit 15 in step S104. Next, in step S106, whether or not the initial boost operation has been finished is decided. The decision may be carried out by the integral power calculation unit 16 itself, or by a higher-level control device (not illustrated) of the integral power calculation unit 16. When, in step S106, it is decided that the initial boost operation has not been finished, the process returns to step S104 in which calculation of input power is carried out by the input power calculation unit 15, and integration of the input power is further carried out in step S105. When, in step S106, it is decided that the initial boost operation has been finished, the process proceeds to step S107. As described above, by a series of operations in steps S104 to S106, the integral power calculation unit 16 integrates the input power calculated by the input power calculation unit 15 over the initial boost period and outputs the integrated value as integral power. In other words, integral power W from the start time to the end time of the initial boost period is calculated by the following formula (2).

$$W = \int P dt = \int (E_u \times I_u + E_v \times I_v + E_u \times I_v) dt \quad (2)$$

After the end of the initial boost period, in step S107, the DC voltage storage unit 14 first stores a DC voltage $V_H$, which is detected by the DC voltage detection unit 13 at the end time of the initial boost period, across the smoothing capacitor 5.

Next, in step S108, the capacitance calculation unit 17 calculates the capacitance C of the smoothing capacitor based on the DC voltage $V_L$ at the start time of the initial boost period and the DC voltage $V_H$ at the end time of the initial boost period, which are stored in the DC voltage storage unit 14, and the integral power W, which is calculated by the integral power calculation unit 16. Energy Δ that is stored in the smoothing capacitor 5 in the duration from the start time to the end time of the initial boost period is calculated by the following formula (3).

$$\Delta = \tfrac{1}{2} \times C \times (V_H^2 - V_L^2) \quad (3)$$

Since the inverter 2 does not operate during the initial boost period as described above and, thus, the AC power taken in from the AC power supply 3 side is converted (rectified) to DC power by the main circuit unit 11 of the PWM rectifier 1 and all stored in the smoothing capacitor 5, the energy Δ stored in the smoothing capacitor 5 in the duration from the start time to the end time of the initial boost period, which is calculated by the formula (3), is equal to the integral power W in the duration from the start time to the end time of the initial boost period, which is calculated by the formula (2). Therefore, the capacitance C of the smoothing capacitor 5 is expressed by the following formula (4).

$$C = \frac{2 \times W}{(V_H^2 - V_L^2)} \quad (4)$$

The capacitance calculation unit 17 calculates the capacitance C of the smoothing capacitor 5 by the formula (4), which is derived in the above-described manner. As clarified by the formula (4), according to the present invention, the capacitance C of the smoothing capacitor 5 is calculated based on the DC voltage $V_L$ at the start time of the initial boost period and the DC voltage $V_H$ at the end time of the initial boost period, which are stored in the DC voltage storage unit 14, and the integral power W, which is calculated by the integral power calculation unit 16. Therefore, since, differing from, for example, the invention disclosed in Japanese Unexamined Patent Publication No. 05-76180, it is possible to calculate the capacitance C of the smoothing capacitor 5 without depending on the peak value of the AC voltage on the AC power supply side and the resistance value of the charging resistor 42, it is possible to measure the capacitance C accurately. Although, in the embodiment, the integral power W is calculated based on the formula (2) since the AC power supply 3 is a three-phase power supply, it is possible to carry out an accurate measurement of the capacitance C independently of the number of phases of the AC power supply, differing from the invention disclosed in International Publication No. 2010/055556, since it is possible to calculate input power (instantaneous active power) flowing into the PWM rectifier 1 by a well-known method even when the AC power supply 3 is a single-phase AC power supply or another polyphase AC power supply. Since no DC current detection unit has to be newly disposed in the measurement, it is possible to achieve a low cost and space-saving PWM rectifier. A result of calculation by the capacitance calculation unit 17 may, for example, be displayed on a display (not illustrated) disposed in the motor control device 100 or stored in a storage means (not illustrated). With this configuration, workers are able to know the capacitance C of the smoothing capacitor 5 every time the PWM rectifier 1 (or motor control device 100) is activated, and, thus, decide whether or not the smoothing capacitor 5 has to be replaced.

When, in step S106, it is decided that the initial boost operation has been finished, the inverter 2 in the motor control device 100 is activated. With this operation, the inverter 2 starts a power conversion operation and transitions to a regular operation mode to supply the motor 4 with drive power, and the motor 4 is driven based on the AC drive power supplied from the inverter 2.

Figure 3:
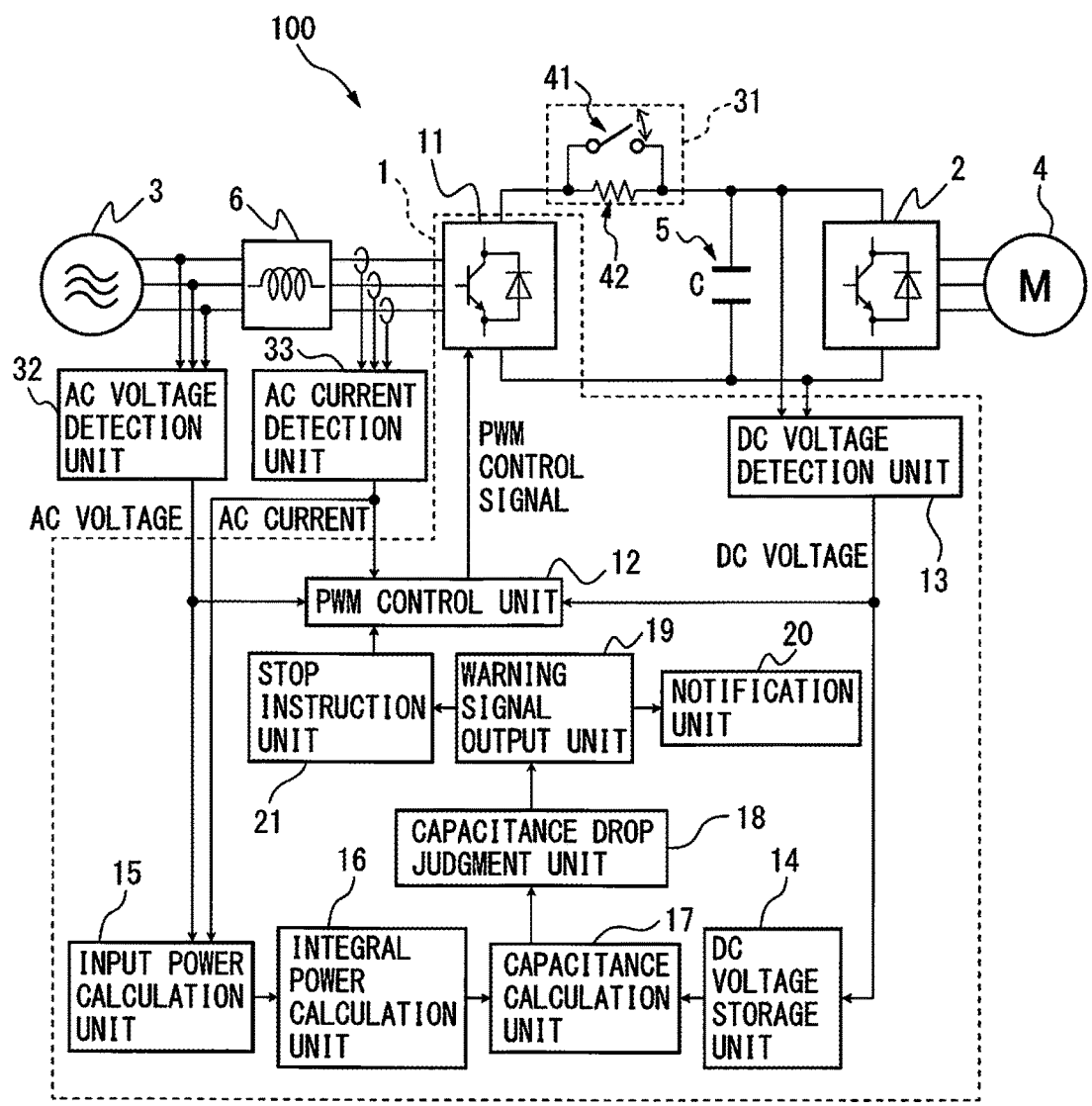
FIG. 3 is a principle block diagram of a PWM rectifier according to a variation of the embodiment.
Figure 4:
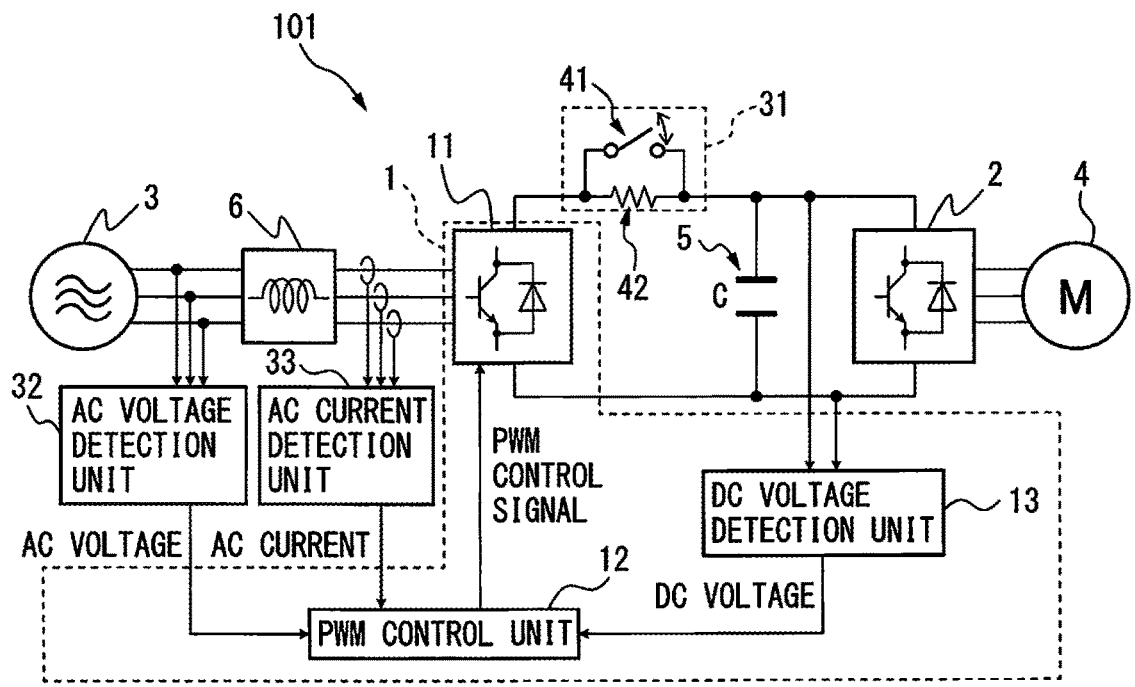
FIG. 4 is a diagram illustrating a configuration of a general motor control device including a PWM rectifier.
Figure 5:
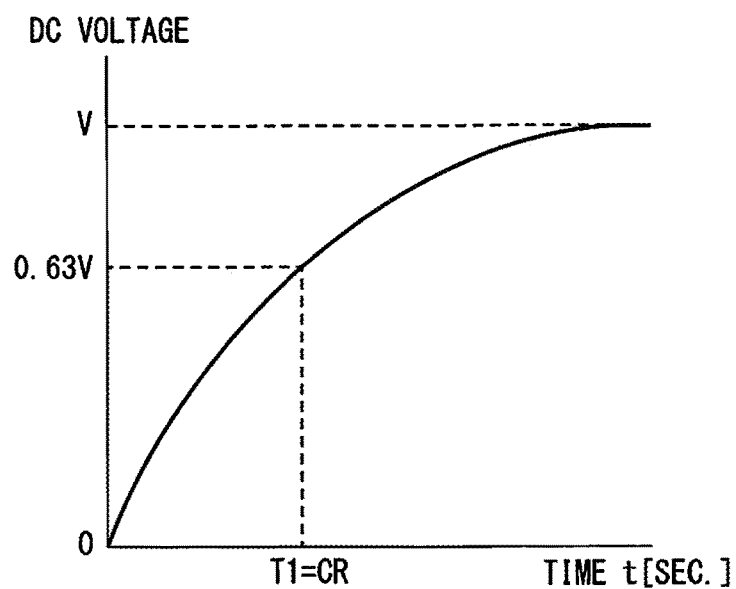
FIG. 5 is a diagram illustrating a capacitor voltage in initial charging in an invention disclosed in Japanese Unexamined Patent Publication No. 05-76180.

Next, a variation of the PWM rectifier will be described. FIG. 3 is a principle block diagram of a PWM rectifier according to a variation of the embodiment. A PWM rectifier 1 according to the variation further includes a capacitance drop judgment unit 18, a warning signal output unit 19, an notification unit 20, and a stop instruction unit 21, using the PWM rectifier described with reference to FIGS. 1 and 2 as a base. Since circuit components other than the above components are the same as the circuit components illustrated in FIG. 1, the same signs are assigned to the same circuit components as in FIG. 1 and a detailed description thereof will be omitted.

The capacitance drop judgment unit 18 judges whether or not the capacitance calculated by the capacitance calculation unit 17 is lower than a predetermined value.

The above-described predetermined value, which the capacitance drop judgment unit 18 uses in the judgment processing, may be set at, for example, a capacitance value which assures that the smoothing capacitor 5 carries out a normal operation.

The warning signal output unit 19 outputs a warning signal when the capacitance drop judgment unit 18 judges that the capacitance is lower than the predetermined value.

When the warning signal output unit 19 outputs a warning signal, the notification unit 20 sends out a notification prompting replacement of the smoothing capacitor 5, which is connected to the DC side of the main circuit unit 11 in parallel. Examples of the notification unit 20 include a speaker producing a warning sound to prompt replacement, such as a buzzer and a siren, a light turning on or flashing to prompt replacement, and a display displaying characters and a pattern to prompt replacement. With such the notification unit 20, workers are able to decide more easily whether or not the smoothing capacitor 5 has to be replaced, compared with plainly displaying a numerical value of the capacitance C of the smoothing capacitor 5.

When the warning signal output unit 19 outputs a warning signal, the stop instruction unit 21 instructs the switching element of the main circuit unit 11 to stop a switching operation. When the stop instruction unit 21 issues an instruction to stop the switching operation, the main circuit unit 11 stops an power conversion operation. With such the stop instruction unit 21, since the PWM rectifier 1 stops the power conversion operation when the capacitance C of the smoothing capacitor 5 is lower than a predetermined value, it is possible to prevent the PWM rectifier 1 from operating in a condition in which a high ripple current or a large DC voltage fluctuation is taking place in the DC link. Although the illustrated example has a configuration in which the stop instruction unit 21 issues an instruction to stop a switching operation to the PWM control unit 12 and, with this instruction, the PWM control unit 12 outputs a control signal to stop the switching operation of the switching element to the main circuit unit 11, another configuration may be employed, as an alternative, in which the stop instruction unit 21 issues an instruction to stop the switching operation directly to the main circuit unit 11, making the main circuit unit 11 stop the switching operation of the switching element.

The above-described PWM control unit 12, input power calculation unit 15, integral power calculation unit 16, capacitance calculation unit 17, capacitance drop judgment unit 18, warning signal output unit 19, and stop instruction unit 21 may be constructed, for example, in a form of software program or in a combination of various types of electronic circuits and a software program. When, for example, these units are constructed in a form of software program, functions of the above-described respective units are achieved by an arithmetic processing device in the motor control device 100 operating in accordance with the software program. It is also possible to apply the present invention to an existing motor control device by additionally installing software programs achieving these means to an arithmetic processing device in the motor control device.

With the present invention, it is possible to achieve a small and low-cost PWM rectifier that makes it possible to accurately measure the capacitance of a smoothing capacitor connected to the DC output side in parallel.

With the present invention, it is possible to accurately measure the capacitance of the smoothing capacitor without depending on the peak value of the AC voltage on the AC power supply side and the resistance value of the charging resistor, differing from the invention disclosed in Japanese Unexamined Patent Publication No. 05-76180, since the capacitance of the smoothing capacitor is calculated based on the DC voltage at the start time of the initial boost period and the DC voltage at the end time of the initial boost period, which are stored in the DC voltage storage unit, and the integral power over the initial boost period. Since the integral power, which is used in the calculation of the capacitance, is calculated by integrating the input power (instantaneous active power) which is easily calculable using a well-known method, it is possible to accurately measure the capacitance regardless of the number of phases of the AC power supply, differing from the invention disclosed in International Publication No. 2010/055556. Since a DC current detection unit does not have to be newly disposed, it is possible to achieve a low-cost and space-saving PWM rectifier.

The calculated capacitance may be displayed on a display or stored in a storage medium, and, with this configuration, workers are able to recognize the capacitance of the smoothing capacitor every time the PWM rectifier is activated, making it possible to easily decide whether or not the smoothing capacitor has to be replaced.

Moreover, employing a configuration in which, when the calculated capacitance is lower than a predetermined value, a warning signal is sent out and a notification prompting the replacement of the smoothing capacitor is issued makes it possible for the workers to more easily decide whether or not the smoothing capacitor has to be replaced.

Furthermore, employing a configuration in which, when the calculated capacitance is lower than a predetermined value, a warning signal is sent out and the stop of a switching operation of the switching element of the main circuit unit is instructed makes it possible to prevent the PWM rectifier from operating in a condition in which a high ripple current and a large DC voltage fluctuation are taking place in the DC link.

What is claimed is:

1. A PWM rectifier, comprising:
a main circuit unit configured to carry out power conversion between AC power on an AC side of the main circuit unit and DC power on a DC side of the main circuit unit through a switching operation of a switching element being PWM-controlled by a received PWM control signal;
a PWM control unit configured to generate and output the PWM control signal to the main circuit unit;
a DC voltage detection unit configured to detect a DC voltage across a smoothing capacitor, which is connected to the DC side of the main circuit unit in parallel;
a DC voltage storage unit configured to, in an initial boost period during which the smoothing capacitor, which has been initially charged to a peak value of an AC voltage on the AC side of the main circuit unit, is further charged to a voltage higher than the peak value of the AC voltage through a power conversion operation of the main circuit unit, store respective DC voltages detected by the DC voltage detection unit at a start time and an end time of the initial boost period;
an input power calculation unit configured to calculate input power flowing into the main circuit unit from the AC side based on an AC voltage and an AC current on the AC side of the main circuit unit;
an integral power calculation unit configured to integrate the input power calculated by the input power calculation unit during the initial boost period and output the integrated value as energy; and
a capacitance calculation unit configured to calculate a capacitance of the smoothing capacitor based on the DC voltage at the start time of the initial boost period and the DC voltage at the end time of the initial boost period, which are stored in the DC voltage storage unit, and the energy.

2. The PWM rectifier according to claim 1,
wherein, when it is assumed that the DC voltage at the start time of the initial boost period, the DC voltage at the end time of the initial boost period, and the energy are denoted by VL, VH, and W, respectively, the capacitance calculation unit calculates a capacitance C of the smoothing capacitor by the following equation $$C = \frac{2 \times W}{V_H^2 - V_L^2}.$$

3. The PWM rectifier according to claim 1, further comprising:
a capacitance drop judgment unit configured to judge whether or not the capacitance calculated by the capacitance calculation unit is lower than a predetermined value; and
a warning signal output unit configured to output a warning signal when the capacitance drop judgment unit judges that the capacitance is lower than the predetermined value.

4. The PWM rectifier according to claim 3, further comprising:
a notification unit configured to prompt a replacement of the smoothing capacitor, which is connected to the DC side of the main circuit unit in parallel, when the warning signal output unit outputs the warning signal.

5. The PWM rectifier according to claim 3, further comprising:
a stop instruction unit configured to instruct stop of the switching operation of the switching element in the main circuit unit when the warning signal output unit outputs the warning signal.

* * * * *